United States Patent
Tomiyasu

(10) Patent No.: US 9,508,544 B2
(45) Date of Patent: Nov. 29, 2016

(54) SEMICONDUCTOR DEVICE AND METHOD FOR MANUFACTURING SAME

(71) Applicant: Sharp Kabushiki Kaisha, Osaka-shi, Osaka (JP)

(72) Inventor: Kazuhide Tomiyasu, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/935,569

(22) Filed: Nov. 9, 2015

(65) Prior Publication Data
US 2016/0064217 A1    Mar. 3, 2016

Related U.S. Application Data

(62) Division of application No. 14/404,046, filed as application No. PCT/JP2013/062442 on Apr. 26, 2013, now abandoned.

(30) Foreign Application Priority Data

May 28, 2012  (JP) ................................. 2012-121018

(51) Int. Cl.
| | |
|---|---|
| *H01L 21/477* | (2006.01) |
| *H01L 21/02* | (2006.01) |
| *H01L 29/786* | (2006.01) |
| *H01L 29/45* | (2006.01) |
| *H01L 29/66* | (2006.01) |

(52) U.S. Cl.
CPC ... *H01L 21/02164* (2013.01); *H01L 21/02211* (2013.01); *H01L 21/02271* (2013.01); *H01L 21/02274* (2013.01); *H01L 21/02403* (2013.01); *H01L 21/477* (2013.01); *H01L 29/45* (2013.01); *H01L 29/66969* (2013.01); *H01L 29/7869* (2013.01); *H01L 29/78606* (2013.01); *H01L 29/78696* (2013.01)

(58) Field of Classification Search
CPC .............. H01L 29/786; H01L 21/477; H01L 29/7869; H01L 29/45; H01L 29/66969; H01L 21/02211; H01L 29/78606; H01L 21/02403; H01L 29/78696; H01L 21/02274; H01L 21/02271; H01L 21/02164; H01L 27/1214; H01L 229/78618; H01L 29/66757; H01L 21/28512

See application file for complete search history.

(56) References Cited

U.S. PATENT DOCUMENTS

| | | | |
|---|---|---|---|
| 5,763,904 A * | 6/1998 | Nakajima | ......... H01L 21/28512 257/347 |
| 7,125,758 B2 * | 10/2006 | Choi | ..................... C23C 16/345 257/E21.293 |

(Continued)

FOREIGN PATENT DOCUMENTS

CN        100497730 C       6/2009

OTHER PUBLICATIONS

Tomiyasu et al., "Semiconductor Device and Method for Manufacturing Same", U.S. Appl. No. 14/404,046, filed Nov. 26, 2014.

*Primary Examiner* — Fazli Erdem
(74) *Attorney, Agent, or Firm* — Keating & Bennett, LLP

(57) ABSTRACT

This semiconductor device (100) includes a substrate (10) and a TFT which is provided on the substrate. The TFT includes a gate electrode (12), an oxide semiconductor layer (14) which faces the gate electrode, source and drain electrodes (16, 18) which are connected to the oxide semiconductor layer, and an insulating layer (22) which contacts at least partially with the source and drain electrodes. The insulating layer (22) includes a lower region (22b) which contacts at least partially with the source and drain electrodes and an upper region (22a) which is located over the lower region. The lower region (22b) has a higher hydrogen content than the upper region (22a).

14 Claims, 5 Drawing Sheets

(56) References Cited

U.S. PATENT DOCUMENTS

| | | | |
|---|---|---|---|
| 2011/0068336 A1* | 3/2011 | Yamazaki | H01L 27/1225 257/43 |
| 2011/0175080 A1* | 7/2011 | Kim | H01L 29/7869 257/43 |
| 2013/0134514 A1* | 5/2013 | Chang | H01L 27/12 257/347 |
| 2015/0187948 A1* | 7/2015 | Misaki | H01L 29/41733 257/43 |

* cited by examiner (a)

(b)

(c)

(d)

(e)

SEMICONDUCTOR DEVICE AND METHOD FOR MANUFACTURING SAME

TECHNICAL FIELD

The present invention relates to a semiconductor device (such as an active-matrix substrate) which has been formed with an oxide semiconductor, and also relates to a method for fabricating such a device.

BACKGROUND ART

An active-matrix substrate for use in a liquid crystal display device and other devices includes switching elements such as thin-film transistors (which will be simply referred to herein as "TFTs"), each of which is provided for an associated one of pixels. As such switching elements, a TFT which uses an amorphous silicon film as its active layer (and will be hereinafter referred to as an "amorphous silicon TFT") and a TFT which uses a polysilicon film as its active layer (and will be hereinafter referred to as a "polysilicon TFT") have been used extensively.

Recently, people have proposed that a material other than amorphous silicon or polysilicon be used as a material for the active layer of a TFT. For example, Patent Document No. 1 discloses a liquid crystal display device, of which the TFT's active layer is formed out of an oxide semiconductor film of InGaZnO (that is an oxide made up of indium, gallium and zinc). Such a TFT will be hereinafter referred to as an "oxide semiconductor TFT".

The oxide semiconductor TFT can operate at higher speeds than an amorphous silicon TFT. Also, such an oxide semiconductor film can be formed by a simpler process than a polysilicon film, and therefore, is applicable to even a device that needs to cover a large area. That is why an oxide semiconductor TFT has been used more and more often in a display device as an active element which achieves even higher performance in its switching operation and which can be fabricated with the number of manufacturing process steps and the manufacturing cost cut down.

In addition, since an oxide semiconductor has high electron mobility, even an oxide semiconductor TFT of a smaller size than a conventional amorphous silicon TFT could achieve performance that is equal to or higher than that of the amorphous silicon TFT. For that reason, by using oxide semiconductor TFTs, the area occupied by the TFT in a pixel region of a display device can be decreased, and therefore, the aperture ratio of the pixel can be increased. Consequently, a display operation can be performed with even higher luminance or the power dissipation can be reduced by decreasing the quantity of light emitted from a backlight.

For example, in a small-sized high-definition liquid crystal display device for use in a smart phone and other electronic devices, it is not easy to increase the aperture ratio of a pixel due to the limit on the minimum width of lines (i.e., the process rule). That is why if the aperture ratio of the pixel can be increased by using an oxide semiconductor TFT, a high-definition display operation can be carried out with the power dissipation cut down, which is advantageous.

CITATION LIST

Patent Literature

Patent Document No. 1: PCT International Application Publication No. 2009/075281

Patent Document No. 2: Japanese Laid-Open Patent Publication No. 2011-100990

SUMMARY OF INVENTION

Technical Problem

In its manufacturing process, an oxide semiconductor TFT is usually subjected to a heat treatment (annealing process) at a relatively high temperature (e.g., about 300° C. or more) in order to improve the performance of the device (see Patent Document No. 2, for example).

This heat treatment is sometimes carried out even after a passivation layer (protective layer) has been formed to cover the oxide semiconductor layer and source and drain electrodes, as disclosed in Patent Document No. 2. If the source and drain electrodes are covered with the passivation layer, it is possible to prevent their surface from being oxidized and coming to have increased resistance during the heat treatment.

However, the present inventors discovered that if the heat treatment described above was carried out after the passivation layer had been formed, the passivation layer could peel off the source and drain electrodes depending on the combination of their materials. It should be noted that such film peeling problem could arise not only between the passivation layer and the source and drain electrodes but also between any other metal line and an insulating layer if the heat treatment is carried out at a high temperature.

The present inventors perfected our invention in order to overcome these problems by providing high-performance semiconductor devices with good stability.

Solution to Problem

A semiconductor device according to an embodiment of the present invention includes: a substrate; a TFT which is provided on the substrate and which includes a gate electrode, a semiconductor layer that is arranged to face the gate electrode with a gate insulating film interposed therebetween, and source and drain electrodes that are electrically connected to the semiconductor layer; and an insulating layer formed on the source and drain electrodes. The insulating layer includes a lower region which contacts at least partially with the upper surface of the source and drain electrodes and an upper region which is located over the lower region. The lower region has a higher hydrogen content than the upper region.

In one embodiment, the surface of at least one of the source and drain electrodes that contacts with the insulating layer is made of Cu or Mo.

In one embodiment, the lower region of the insulating layer is made of $SiO_2$.

In one embodiment, the semiconductor layer is an oxide semiconductor layer.

In one embodiment, the oxide semiconductor layer is an In—Ga—Zn—O based semiconductor layer.

In one embodiment, the insulating layer is a passivation layer which covers the TFT.

In one embodiment, the semiconductor device further includes a channel protective layer which is arranged on the semiconductor layer to face the gap between the source and drain electrodes.

A method for fabricating a semiconductor device according to the present invention includes the steps of: providing a substrate; forming a TFT on the substrate, the TFT including a gate electrode, a semiconductor layer which is arranged to face the gate electrode with a gate insulating film interposed between them, and source and drain electrodes which are electrically connected to the semiconductor layer; forming an insulating layer which contacts at least partially with the upper surface of the source and drain electrodes; and conducting a heat treatment after performing the step of forming an insulating layer. The step of forming an insulating layer includes forming the insulating layer so that the content of hydrogen becomes higher in a region which is in contact with the source and drain electrodes than in a region which is out of contact with the source and drain electrodes.

In one embodiment, the semiconductor layer is an oxide semiconductor layer.

In one embodiment, the oxide semiconductor layer is an In—Ga—Zn—O based semiconductor layer.

In one embodiment, the heat treatment is carried out at a temperature of 200° C. to 400° C.

In one embodiment, the step of forming the insulating layer includes forming an $SiO_2$ layer using $SiH_4$ gas and $N_2O$ gas, and in the step of forming the $SiO_2$ layer, an $SiH_4/N_2O$ flow rate ratio is changed.

In one embodiment, the step of forming the insulating layer includes forming an $SiO_2$ layer by CVD process, and in the step of forming the $SiO_2$ layer, an output RF voltage of the CVD process is changed.

In one embodiment, the step of forming the insulating layer includes forming an $SiO_2$ layer by CVD process, and in the step of forming the $SiO_2$ layer, a film deposition pressure of the CVD process is changed.

In one embodiment, the step of forming the insulating layer includes forming a lower insulating layer by CVD process and forming an upper insulating layer on the lower insulating layer by sputtering process. The lower and upper insulating layers are formed so that the content of hydrogen becomes higher in the lower insulating layer than in the upper insulating layer.

Advantageous Effects of Invention

With a semiconductor device according to an embodiment of the present invention, a TFT which has good device characteristics can be obtained with a metal line and an insulating layer that contacts with the metal line kept in close contact with each other.

DESCRIPTION OF EMBODIMENTS

First of all, peeling of an insulating layer (or insulating film) off a metal line, which could arise during a heat treatment at a high temperature, will be described.

Recently, a source line (including a source electrode and a drain electrode) is sometimes formed out of a metal film of Cu (copper) or Mo (molybdenum) in order to lower the resistance. For example, a process of making a source line with a multilayer structure (consisting of an upper Cu layer and a lower Ti layer, for example) on a transparent oxide semiconductor has been studied. And the source line is usually covered with an insulating layer such as a silicon oxide ($SiO_x$) layer or a silicon nitride ($SiN_x$) layer.

For example, in a reverse staggered TFT, its source and drain electrodes are covered with an insulating layer which functions as a protective layer (i.e., a passivation layer). Such a passivation layer is often formed to cover a semiconductor layer, too. Thus, in an oxide semiconductor TFT, by forming the passivation layer out of an $SiO_x$ layer, it is possible to prevent oxygen in the semiconductor layer from moving toward the passivation layer to increase off-state current or to make the threshold voltage go negative.

However, the present inventors discovered that if the surface of a source line was made of Cu (copper), for example, and if a passivation layer (such as an $SiO_2$ based insulating layer) was deposited using $SiH_4$ and $N_2O$ gases and then subjected to an annealing process at a high temperature, then the passivation layer could peel off the source line.

The reason why such film peeling occurred would be that if a metal line of which the surface is made of Cu (i.e., the source line) and an insulating layer are in contact with each other and if the content of hydrogen in the insulating layer is low, then $Cu_2O$, for example, would be produced more easily on the surface. If the insulating layer is deposited under a condition on which $Cu_2O$ would be produced easily (i.e., the absolute quantity of $Cu_2O$ produced would be significant), that film peeling could occur when subjected to a heat treatment at as high a temperature as 300° C. or more, for example (see FIGS. 6(a) to 6(c)).

The present inventors carried out an intensive research to address such a problem. As a result, the present inventors discovered that to effectively prevent an insulating layer which is in contact with a metal layer from peeling, that insulating layer suitably has a relatively high hydrogen content.

However, normally such an insulating layer including a lot of hydrogen is not provided for an oxide semiconductor TFT. The reason is that if a lot of hydrogen were included in an oxide semiconductor layer, the device characteristic of the oxide semiconductor element might deteriorate. For example, Patent Document No. 2 discloses that an annealing process may be performed to dehydrogenate an oxide semiconductor layer.

Figure 1:
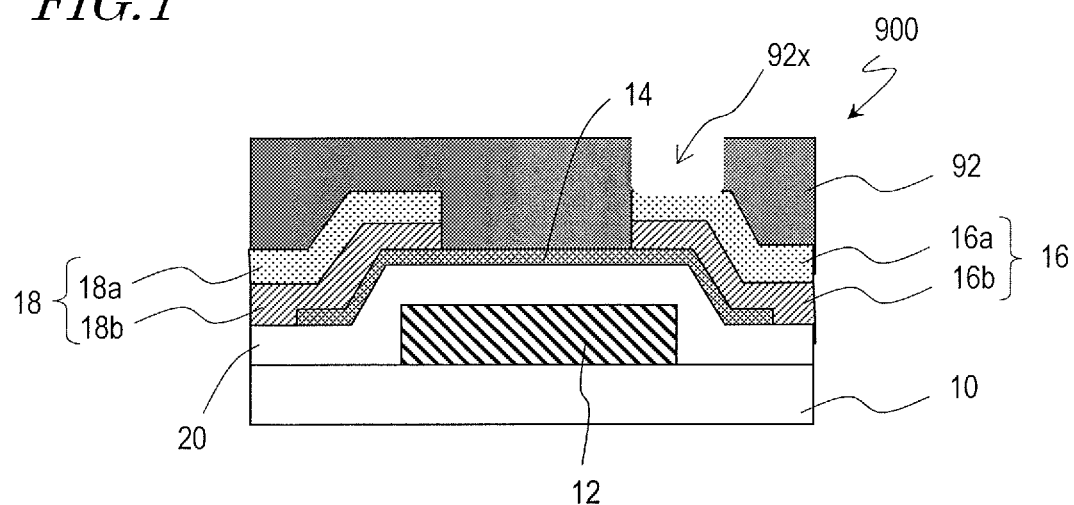
FIG. 1 A cross-sectional view illustrating an oxide semiconductor TFT as a comparative example.

FIG. 1 illustrates a configuration for an oxide semiconductor TFT 900 as a comparative example, which includes, on a substrate 10, a gate electrode 12, a gate insulating film 20, and an oxide semiconductor layer 14. On the oxide semiconductor layer 14, source and drain electrodes 16 and 18 are arranged so as to be spaced apart from each other. Each of the source and drain electrodes 16 and 18 has a multilayer structure, in which an upper electrode 16*a*, 18*a* has been stacked on a lower electrode 16b, 18b. Also, the lower electrode 16b, 18b is made of Ti and the upper electrode 16a, 18a is made of Cu. And a passivation layer 92 has been formed to contact with these upper electrodes 16a and 18a of Cu.

The passivation layer 92 has been formed to have as low a hydrogen content as possible. This is because if an oxide semiconductor TFT were fabricated in an environment in which the passivation layer 92 includes a lot of hydrogen, then hydrogen would be introduced into the oxide semiconductor layer to possibly deteriorate the device characteristic. However, if the passivation layer 92 has a low hydrogen content, film peeling 92x could occur when an annealing process is carried out at a temperature of 300° C. or more.

Thus, to overcome such a problem, an embodiment of the present invention adopts a configuration in which an insulating layer with a relatively high hydrogen content is arranged in contact with a metal line, of which the surface is made of Co or Mo, for example, and in which an insulating layer with a relatively low hydrogen content is provided where the insulating layer does not contact with the metal line.

Figure 2:
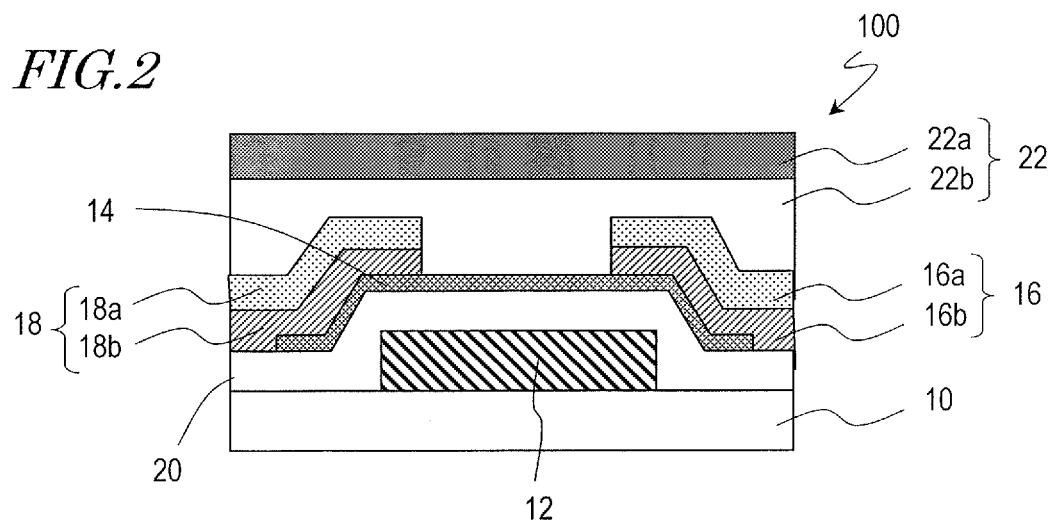
FIG. 2 A cross-sectional view illustrating an oxide semiconductor TFT as a first embodiment of the present invention.

FIG. 2 illustrates a configuration for an oxide semiconductor TFT 100 as a first embodiment of the present invention. In the embodiment illustrated in FIG. 2, provided is an insulating layer 22 consisting of two insulating layers 22a and 22b with mutually different hydrogen contents. Except that insulating layer 22 provided as a passivation layer, however, every other component of this oxide semiconductor TFT 100 is the same as its counterpart of the oxide semiconductor TFT 900 of the comparative example shown in FIG. 1, and will be identified herein by the same reference numeral as its counterpart's and description thereof will be omitted herein.

In this oxide semiconductor TFT 100, the lower insulating layer 22b which forms part of the insulating layer 22 that contacts with the metal line layer (i.e., the source and drain electrodes 16, 18 in this example) has a relatively high hydrogen content. On the other hand, the upper insulating layer 22a arranged on the lower insulating layer 22b has a lower hydrogen content than the lower insulating layer 22b. That is to say, the hydrogen content of the insulating layer 22 is not uniform in the thickness direction. And a portion of the insulating layer 22 that is located closer to the metal layer is a region with a relatively high hydrogen content, while the rest of the insulating layer 22 that is located away from the metal line is a region with a relatively low hydrogen content.

Optionally, the insulating layer 22 may be comprised of three or more regions (layers) with mutually different hydrogen contents. Also, although those regions are illustrated in FIG. 1 as forming a multilayer structure, this is just an example and those regions do not always have a layered structure. Alternatively, the insulating layer 22 may also have a structure in which the hydrogen content decreases gradually away from the metal line (i.e., the more distant from the metal line, the lower the hydrogen content).

If the insulating layer 22 arranged on the metal line 16, 18 includes a region with a relatively high hydrogen content (i.e., the lower insulating layer 22b) in contact with the metal line 16, 18, it is possible to prevent the insulating layer 22 from peeling even when subjected to an annealing process at a high temperature. In addition, by arranging a region with a relatively low hydrogen content (i.e., the upper insulating layer 22a) on the lower insulating layer 22b, the oxide semiconductor TFT can be protected appropriately and deterioration of its device characteristic can be suppressed.

To vary the content of hydrogen in an insulating layer to be formed on a metal line (such as the source and drain electrodes), the deposition condition of the insulating layer may be changed. For example, if an $SiO_2$ film is formed as the insulating layer 22, the flow rate ratio (i.e., the $SiH_4/N_2O$ ratio) of $SiH_4$ (mono-silane) and $N_2O$ (nitrous oxide) gases to be introduced as source gases (or reactive gases) into the reaction chamber may be changed. Then, the hydrogen content of the $SiO_2$ film to be formed can be varied in the thickness direction. Alternatively, the hydrogen content of the $SiO_2$ film can also be adjusted by controlling the amount of unreacted $SiH_4$ in the reaction chamber by changing the reactivity between the $SiH_4$ and $N_2O$ gases.

Still alternatively, instead of forming the insulating layer 22 with varying hydrogen content (consisting of the lower insulating layer 22b and the upper insulating layer 22a) continuously by changing the deposition condition as described above, the lower and upper insulating layers 22b and 22a may be formed in two different manufacturing process steps. For example, the lower insulating layer 22b may be formed by CVD process and the upper insulating layer 22a may be formed by sputtering process.

It has been known in the art that a protective film which covers an oxide semiconductor TFT may have a multilayer structure. For example, Patent Document No. 2 teaches providing a protective film with a multilayer structure, of which a portion that contacts with the oxide semiconductor layer is made of $SiO_2$ and in which the layer to be formed over the $SiO_2$ film is an $SiN_2$ film. However, the conventional insulating layer is not an insulating layer of which the hydrogen content varies in the thickness direction and does not have a multilayer structure in which the closeness of contact with the metal line layer can be increased.

Now it will be described how to fabricate the oxide semiconductor TFT 100 of the first embodiment shown in FIG. 2.

FIGS. 3(a) to 3(e) illustrate respective manufacturing process steps to fabricate the oxide semiconductor TFT 100.

Figure 3:
FIG. 3 (a) through (e) are cross-sectional views illustrating respective manufacturing process steps to fabricate an oxide semiconductor TFT according to an embodiment of the present invention.
Figure 3:
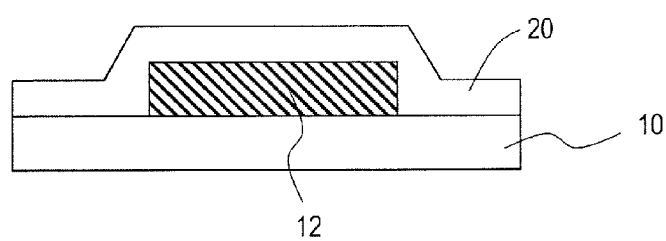
Figure 3:
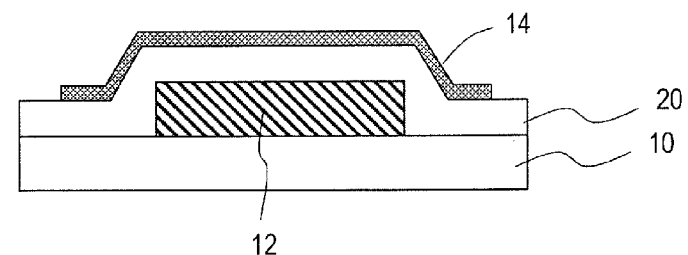
Figure 3:
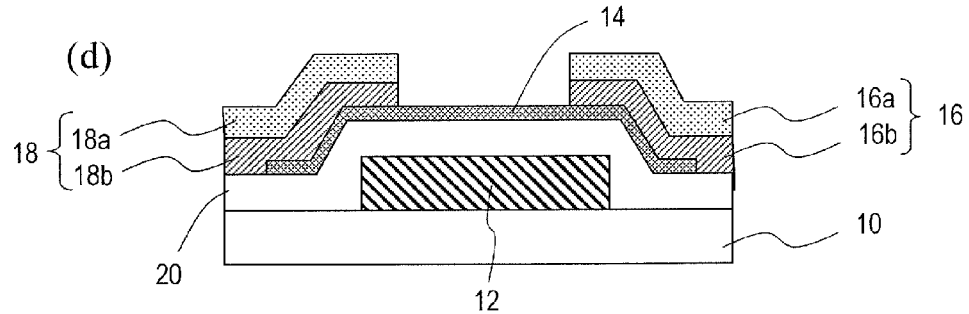
Figure 3:
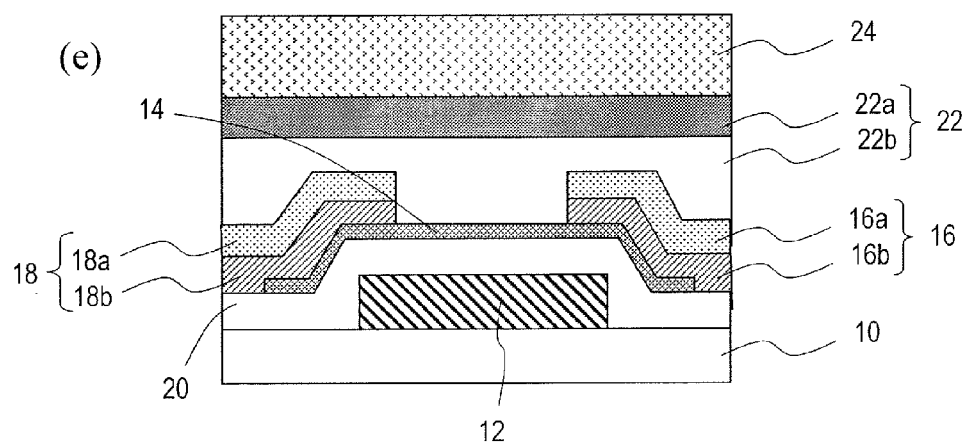

First of all, as shown in FIG. 3(a), a transparent substrate 10 is provided. The transparent substrate 10 may be a glass substrate, a silicon substrate, or a plastic or resin substrate with thermal resistance. Examples of the plastic or resin substrates include substrates made of polyethylene terephthalate (PET), polyethylene naphthalate (PEN), polyether sulfone (PES), an acrylic resin, and a polyimide resin.

Next, a conductive film to be a gate line 12 and other members is deposited to a thickness of 50 nm to 300 nm over the transparent substrate 10. The conductive film may be made of a metallic element selected appropriately from the group consisting of aluminum (Al), tungsten (W), molybdenum (Mo), tantalum (Ta), chromium (Cr), titanium (Ti), and copper (Cu) or an alloy or metal nitride thereof. Or the conductive film may also be a stack of multiple layers of any of these metallic elements.

In this embodiment, a conductive film with a double layer structure consisting of an aluminum (Al) layer and a titanium (Ti) layer is deposited to a thickness of 300 nm by sputtering process, and then patterned into an intended shape by performing a photolithographic process using a resist mask, thereby forming a gate electrode 12 and other conductive members. If an active-matrix substrate (see FIG. 7, for example) is fabricated for a display device, a gate bus line and a storage capacitor line may also be formed simultaneously with the gate electrode 12.

Thereafter, as shown in FIG. 3(b), a gate insulating film 20 is formed over the gate electrode 12. The gate insulating film 20 may be made of a material to be appropriately selected from the group consisting of silicon oxide ($SiO_x$), silicon nitride ($SiN_x$), silicon oxynitride ($SiO_xN_y$, where x>y), and silicon nitride oxide ($SiN_xO_y$, where x>y), for example.

Optionally, to prevent dopants from diffusing from the substrate 10, a lower gate insulating film may be provided. The lower gate insulating film may be made of silicon nitride ($SiN_x$) or silicon nitride oxide ($SiN_xO_y$, where x>y), for example. On the other hand, the upper gate insulating film to be arranged over the lower gate insulating film may be made of silicon oxide ($SiO_x$) or silicon oxynitride ($SiO_xN_y$, where x>y), for example. To form a dense insulating film with little gate leakage current at a lower deposition temperature, a rare gas element such as argon may be added to the reactive gas so as to be introduced into the insulating film. In this embodiment, a silicon nitride film and a silicon dioxide film were deposited as a stack to a thickness of 100 nm to 400 nm and a thickness of 50 nm to 100 nm as the lower and upper gate insulating films, respectively, with $SiH_4$ (mono-silane) and $NH_3$ (ammonia) gases used as reactive gases.

Thereafter, as shown in FIG. 3(c), an oxide semiconductor film is deposited by sputtering process to a thickness of 30 to 100 nm over the gate insulating film 20 and then etched and patterned into a predetermined shape (typically into islands) by photolithographic process using a resist mask, thereby obtaining an oxide semiconductor layer 14. Optionally, the oxide semiconductor layer 14 thus formed may be subjected to oxygen plasma processing.

A material for the oxide semiconductor layer 14 may be selected from the group consisting of $InGaO_3(ZnO)_5$, magnesium zinc oxide ($Mg_xZn_{1-x}O$), cadmium zinc oxide ($Cd_xZ_{1-x}O$), cadmium oxide (CdO) and In—Ga—Zn—O based amorphous oxide semiconductors. Furthermore, the oxide semiconductor layer 14 may also be made of ZnO in an amorphous state, a polycrystalline state, or a microcrystalline state (which is a mixture of amorphous and polycrystalline states) to which one or multiple dopant elements selected from the group consisting of Group I, Group XIII, Group XIV, Group XV and Group XVII elements have been added, or may naturally be ZnO to which no dopant elements have been added at all.

As described above, the oxide semiconductor layer 14 may include an In—Ga—Zn—O based semiconductor (will be hereinafter referred to as an "In—Ga—Zn—O based semiconductor"), for example. In this case, the In—Ga—Zn—O based semiconductor is a ternary oxide of In (indium), Ga (gallium) and Zn (zinc). The ratios (i.e., mole fractions) of In, Ga and Zn are not particularly limited. For example, In:Ga:Zn=2:2:1, In:Ga:Zn=1:1:1 or In:Ga:Zn=1:1:2 may be satisfied.

The oxide semiconductor layer does not have to be an In—Ga—Zn—O based semiconductor layer, but may also include a Zn—O based (ZnO) semiconductor, an In—Zn—O based (IZO) semiconductor, a Zn—Ti—O based (ZTO) semiconductor, a Cd—Ge—O based semiconductor, a Cd—Pb—O based semiconductor, a CdO (cadmium oxide) based semiconductor, an Mg—Zn—O based semiconductor, an In—Sn—Zn—O based semiconductor (such as $In_2O_3$—$SnO_2$—ZnO) or an In—Ga—Sn—O based semiconductor, for example.

Thereafter, as shown in FIG. 3(d), a conductive film is deposited over the oxide semiconductor layer 14 and then patterned into an intended shape by photolithographic process using a resist mask, thereby forming a source electrode 16 and a drain electrode 18. In this example, the conductive film may be made of molybdenum (Mo), copper (Cu), titanium (Ti) or any other suitable metal or an alloy or a metal nitride thereof. In this embodiment, source and drain electrodes 16, 18 with a multilayer structure, of which the upper electrode 16a, 18a is made of Cu and the lower electrode 16b, 18b is made of Ti, are formed.

Optionally, the source and drain electrodes 16 and 18 may include a layer which is made of a material with a light transmitting property such as indium tin oxide (ITO), indium zinc oxide (IZO), indium tin oxide including silicon dioxide (ITSO), indium oxide ($In_2O_3$), tin oxide ($SnO_2$), zinc oxide (ZnO) or titanium nitride. In this embodiment, however, the surface of the source and drain electrodes 16, 18 is made of either Cu or Mo.

Also, the etching process to be performed in the photolithographic process may be either a dry etching process or a wet etching process. To process a substrate with a large area, however, a dry etching process which will cause a little variation in line width or size is suitably adopted.

Next, as shown in FIG. 3(e), an insulating layer (passivation layer) 22 is deposited as a protective layer over the entire surface of the thin-film transistor. This insulating layer 22 may be a silicon oxide ($SiO_x$) film which has been deposited by CVD process using a mixture of $SiH_4$ and $N_2O$ gases as a reactive gas.

In this embodiment, a film deposition condition is changed during the process step of forming the insulating layer 22. More specifically, the $SiH_4/N_2O$ flow rate ratio, the RF power or the film deposition pressure is changed. Naturally, two or more film deposition conditions may be changed in combination. In this manner, silicon oxide ($SiO_x$) films of the same film type and of different film qualities can be formed.

Figure 6:
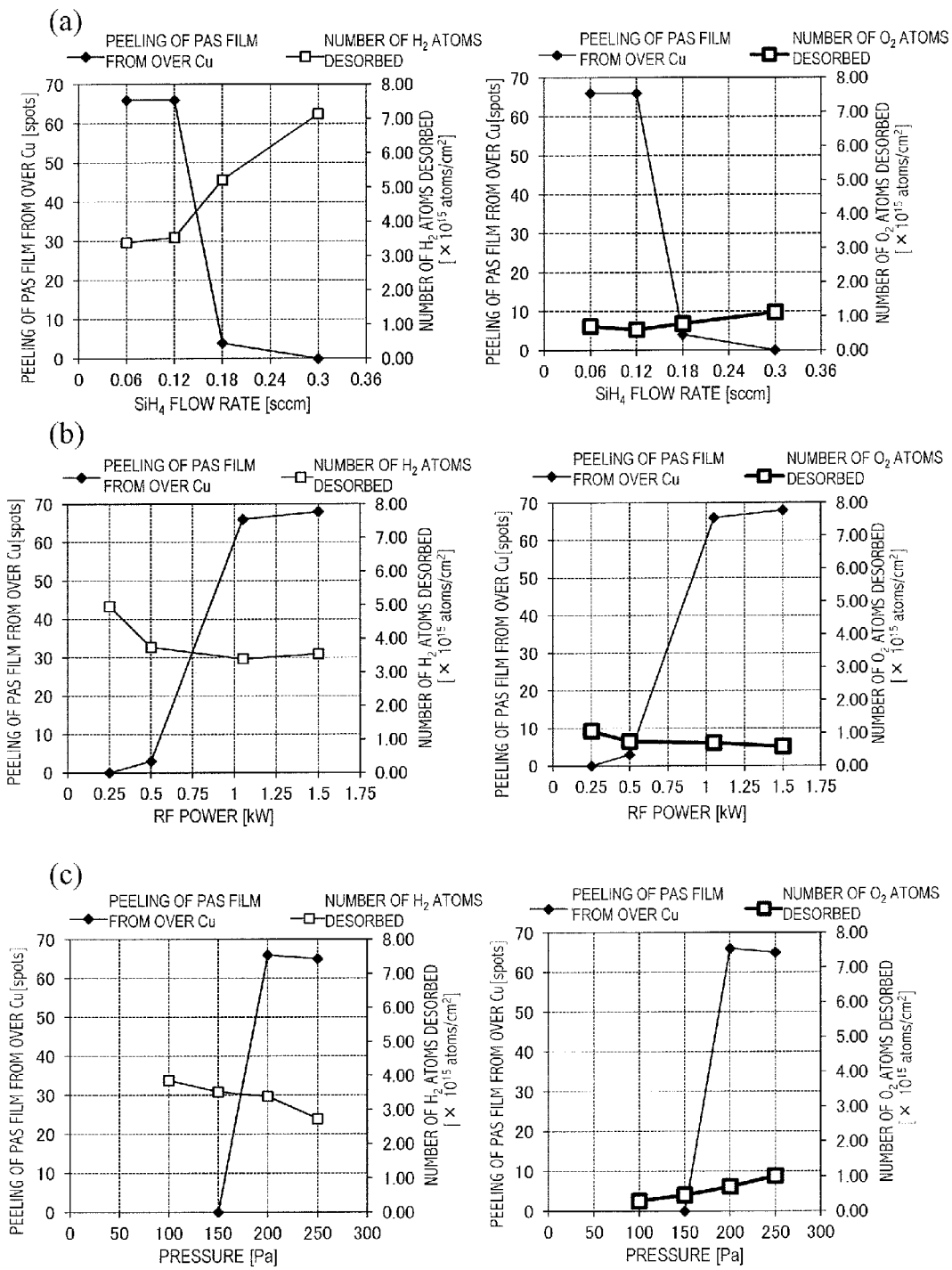
FIGS. 6 (a), (b) and (c) are graphs showing how the frequency of occurrence of film peeling and the number of hydrogen atoms desorbed changed with the $SiH_4$ flow rate, the RF power and the film deposition pressure, respectively.

FIGS. 6(a) to 6(c) show, on the left-hand side, how the frequency of occurrence of film peeling (i.e., peeling of an $SiO_2$ film (PAS film) off a Cu line) and the number of hydrogen atoms desorbed changed with the $SiH_4/N_2O$ flow rate ratio, the RF power (i.e., the output of an RF voltage applied to an electrode to generate plasma) and the film deposition pressure (i.e., the pressure in the reaction chamber) when the film was deposited by plasma CVD process. On the right-hand side of FIGS. 6(a) to 6(c), illustrated are graphs showing the number of oxygen atoms desorbed for your reference. It should be noted that the number of hydrogen atoms desorbed and the number of oxygen atoms desorbed shown in these graphs were obtained by evaluating the $SiO_2$ film that had been deposited on the substrate by thermal desorption spectroscopy.

As can be seen from FIG. 6(a), if the $SiH_4$ flow rate and the $SiH_4/N_2O$ flow rate ratio were increased, the content of $H_2$ increased and the frequency of occurrence of peeling of the insulating layer (PAS film) decreased. This is probably because by increasing the flow rate of $SiH_4$, not only the amount of hydrogen in the reaction chamber but also the hydrogen content of the insulating layer formed increased so much that a metal oxide film such as $CuO_2$ could be prevented from being formed on the metal line. As can be seen, if an insulating layer with a relatively high hydrogen content was formed on the metal line, the frequency of occurrence of film peeling decreased.

On the other hand, as can be seen from FIGS. 6(b) and 6(c), if either the RF power or the film deposition pressure was changed while an $SiO_2$ film was being deposited over the substrate by CVD process using $SiH_4$ and $N_2O$ gases as source gases, the hydrogen content also changed.

According to a film deposition condition that will result in a high hydrogen content (i.e., if the RF power is relatively low or if the film deposition pressure is relatively low), the reaction of the reaction gases is retarded and there will be unreacted $SiH_4$ gas in the reaction chamber. If the film is deposited under such a condition, an insulating layer including a lot of hydrogen would be formed, production of a metal oxide film of $CuO_2$, for example, would be suppressed, and therefore, film peeling would occur much less often.

That is why in the process step of forming the insulating layer 22, when the initial insulating layer that contacts with the source and drain electrodes 16, 18 is formed, the insulating layer may be deposited under a condition with a high $SiH_4/N_2O$ ratio. And by depositing the insulating layer with the $SiH_4/N_2O$ ratio decreased after that, the lower insulating layer 22b with a relatively high hydrogen content and the upper insulating layer 22a with a relatively low hydrogen content can be formed. Alternatively, even if the lower insulating layer 22b is formed by adopting initially a film deposition condition that will result in relatively low reactivity between $SiH_4$ and $N_2O$ gases (e.g., a condition including a low RF power or a relatively low film deposition pressure) and then the upper insulating layer 22a is formed by adopting a film deposition condition that will result in relatively high reactivity between $SiH_4$ and $N_2O$ gases, the insulating layer 22 with varying hydrogen content can also be formed.

Optionally, the insulating layer 22 may also have another configuration. For example, the lower insulating layer 22b may be an $SiO_2$ film formed by CVD process and the upper insulating layer 22a may be an $SiO_2$ film formed by sputtering process. Even so, by setting the film deposition condition appropriately, the hydrogen content of the lower insulating layer 22b may be higher than that of the upper insulating layer 22a.

After that, by subjecting the entire substrate to a heat treatment at approximately 350° C., the device characteristic and reliability of the oxide semiconductor TFT can be improved. The heat treatment is suitably carried out at a temperature of 200° C. to 400° C., and more suitably conducted at a temperature of 250° C. to 350° C.

In this process step, since the upper layer 16a, 18a of the metal line of Cu is in contact with the lower insulating layer 22b with a relatively high hydrogen content in the oxide semiconductor TFT 100 of this embodiment, the insulating layer 22 can be prevented from peeling even if the substrate is subjected to the heat treatment at such a temperature.

Figure 7:
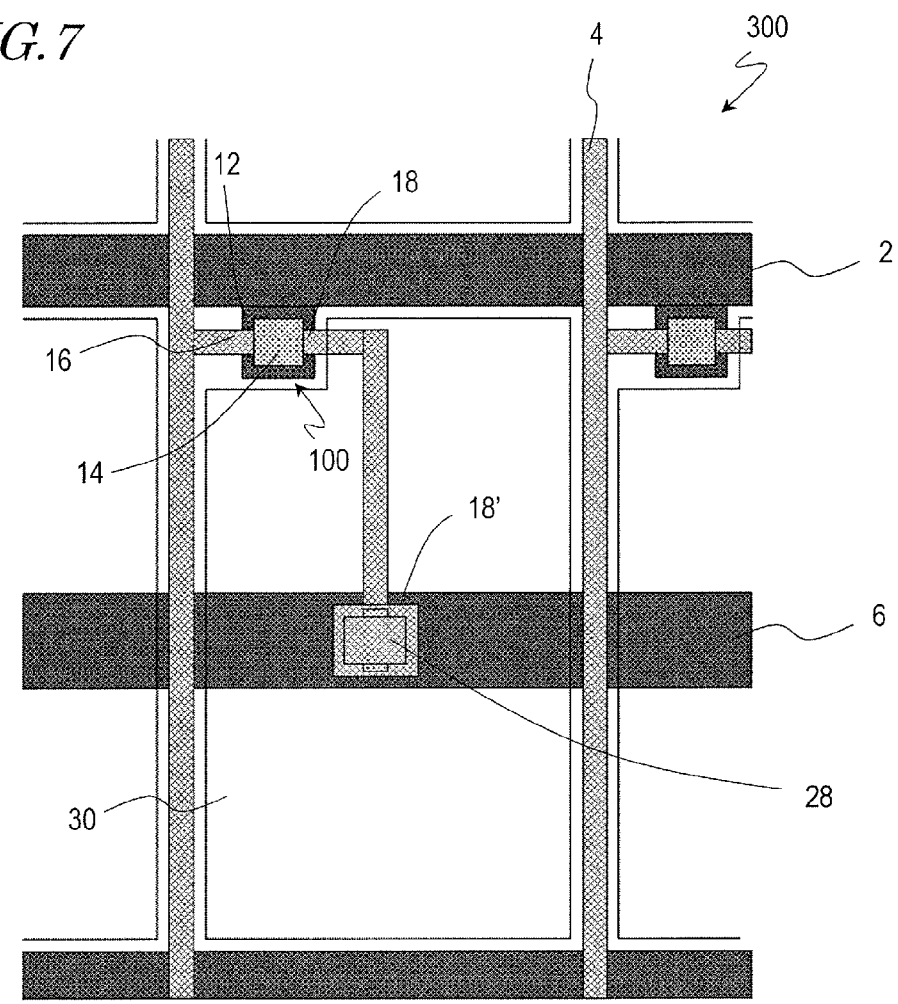
FIG. 7 A plan view illustrating a configuration for a TFT substrate for use in a display device according to a third embodiment of the present invention.

An oxide semiconductor TFT 100 can be fabricated by performing these manufacturing process steps. If an active-matrix substrate (see FIG. 7) for use in a display device is fabricated, then an interlayer insulating film (planarizing film) 24 may be formed out of a photosensitive organic insulating film over the insulating layer 22, and then a transparent pixel electrode 30 of ITO or IZO (indium zinc oxide) is formed on the interlayer insulating film 24. As shown in FIG. 7, the transparent pixel electrode 30 is electrically connected to the drain electrode 18 via a connecting portion 18' through a contact hole 28 which has been cut through the interlayer insulating film 24 and the insulating layer 22.

Figure 4:
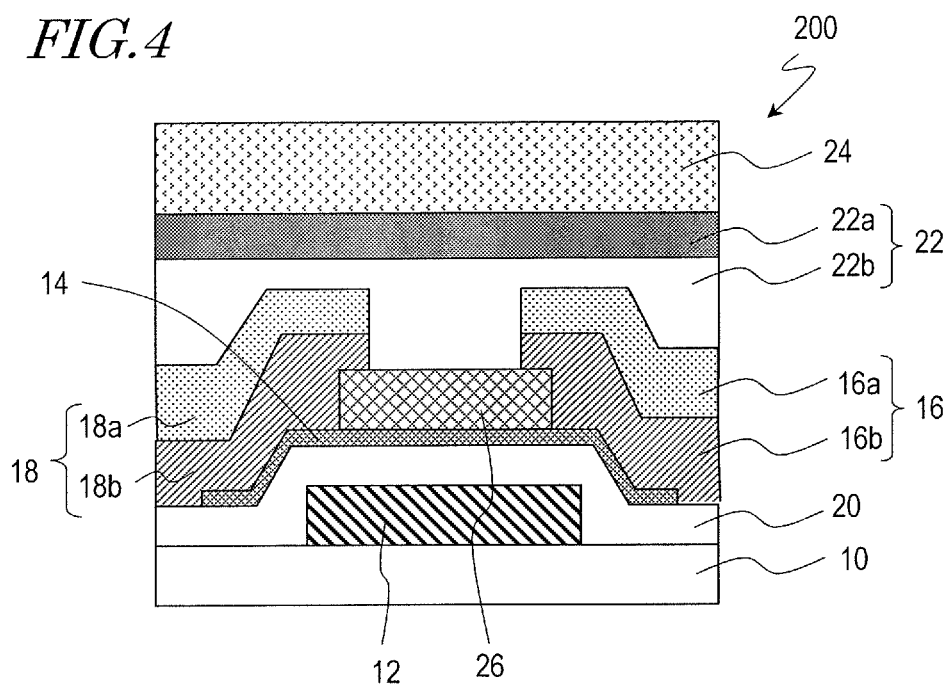
FIG. 4 A cross-sectional view illustrating an oxide semiconductor TFT as a second embodiment of the present invention.
Figure 5:
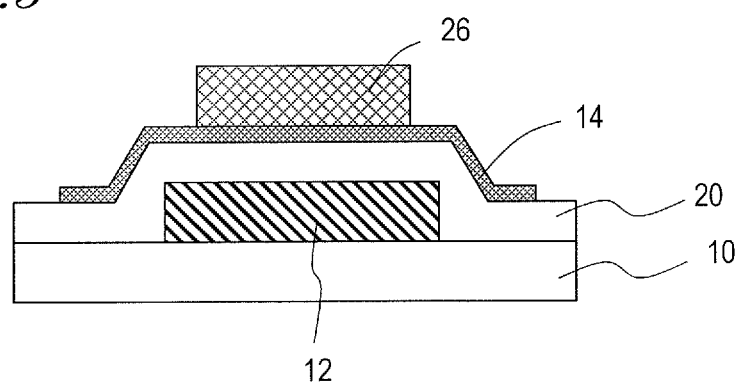
FIG. 5 A cross-sectional view illustrating a manufacturing process step to fabricate an oxide semiconductor TFT according to the second embodiment of the present invention.

FIG. 4 illustrates an oxide semiconductor TFT 200 as a second embodiment. In the oxide semiconductor TFT 200 of this embodiment, a channel protective layer 26 has been formed on the oxide semiconductor layer 14, which is a difference from the oxide semiconductor TFT 100 of the first embodiment. Such an oxide semiconductor TFT 200 can be fabricated by performing an additional process step of forming a channel protective layer 26 as shown in FIG. 5 after the oxide semiconductor layer 14 has been formed as shown in FIG. 3(c) in the manufacturing process of the first embodiment shown in FIGS. 3(a) to 3(e).

Since the channel protective layer 26 functions as an etch stopper in the process step of forming source and drain electrodes 16 and 18 shown in FIG. 3(d), the damage that could be done on the oxide semiconductor layer 14 while the source and drain electrodes 16 and 18 are being formed can be reduced.

The channel protective layer 26 may be made of a material which is appropriately selected from the group consisting of silicon oxide ($SiO_x$), silicon nitride ($SiN_x$), silicon oxynitride ($SiO_xN_y$, where x>y), and silicon nitride oxide ($SiN_xO_y$, where x>y), for example. The channel protective layer 26 contacts with the oxide semiconductor layer 14, and therefore, is suitably made of $SiO_x$. However, this channel protective layer 26 may have a different property (e.g., a different hydrogen content) from the insulating layer 22b to be formed thereon.

FIG. 7 illustrates a configuration for a TFT substrate 300 (as a third embodiment) including the oxide semiconductor TFT 100 of the first embodiment. This TFT substrate 300 may be used in a liquid crystal display device, for example. And by interposing airtight a liquid crystal layer between the TFT substrate 300 and a counter substrate (not shown), a liquid crystal display device can be obtained.

As shown in FIG. 7, the TFT substrate 300 includes gate bus lines 2 which run horizontally, source bus lines 4 which run in such a direction as to intersect (typically to cross at right angles) with the gate bus lines 2, and a storage capacitor bus line 6 which runs between two adjacent ones of the gate bus lines 2. Also, in the vicinity of each intersection between the gate and source bus lines 2 and 4, arranged is the oxide semiconductor TFT 100 of the first embodiment. The gate electrode 12 of the oxide semiconductor TFT 100 forms an integral part of the gate bus line 2, and the source electrode 14 thereof forms an integral part of the source bus line 4.

In addition, a connecting portion 18' is also provided as an extended portion of the drain electrode 18. At this connecting portion 18', the pixel electrode 30 arranged on the interlayer insulating film 24 (see FIG. 3(e)) is electrically connected to the drain electrode 18.

Even though some embodiments of the present invention have been described above, those embodiments are naturally modifiable in various manners. For example, although a bottom-gate-type TFT, of which the gate electrode is arranged under a semiconductor layer, has been described, the present invention is also applicable to a TFT with a top gate structure. In a TFT with the top gate structure, a gate electrode is arranged over a semiconductor layer with a gate insulating film interposed between them, source and drain electrodes are arranged so as to be connected to the semiconductor layer through a contact hole, and an insulating layer is provided as a protective layer so as to cover all of these members. Even so, if the surface of the source and drain electrodes is made of Cu or Mo and if the hydrogen content of a portion of the insulating layer that contacts with the surface is selectively increased, a good device characteristic is realizable with film peeling eliminated.

Although an embodiment in which the upper surface of the semiconductor layer contacts with the source and drain electrodes has been described, the present invention is also applicable to a TFT with a bottom contact structure which is obtained by forming the source and drain electrodes first and then forming a semiconductor layer over the source and drain electrodes. Such a structure is disclosed in FIG. 4 (top gate—bottom contact) of Patent Document No. 1, for example. Meanwhile, FIG. 3(A) of Patent Document No. 2 discloses a TFT with a bottom gate—bottom contact structure. The present invention is applicable to a TFT with any of these structures. And by varying the hydrogen content of an insulating layer, which is formed over a metal line that should have low resistance, in the thickness direction, a TFT with a good device characteristic can be obtained with the insulating layer kept in close contact with the metal line.

Also, although an active-matrix substrate for use in a liquid crystal display device has been described, an active-matrix substrate for use to make an organic EL display device may also be fabricated. In an organic EL display device, a light-emitting element which is provided for each pixel includes an organic EL layer, a switching TFT and a driver TFT. And a semiconductor device according to an embodiment of the present invention can be used as any of those TFTs. Furthermore, by arranging those TFTs as an array and using them as select transistors, a storage element (i.e., an oxide semiconductor thin-film memory) can also be formed.

INDUSTRIAL APPLICABILITY

A semiconductor device according to an embodiment of the present invention and a method for fabricating such a device can be used effectively as a TFT substrate for a display device and a method for fabricating such a device, for example.

REFERENCE SIGNS LIST

100 TFT substrate
2 gate bus line
4 source bus line
6 storage capacitor bus line
10 transparent substrate
12 gate electrode
14 oxide semiconductor layer
16 source electrode
18 drain electrode
20 gate insulating film
22 insulating layer (passivation layer)
24 interlayer insulating film (planarizing film)
26 channel protective layer
28 contact hole
30 pixel electrode

The invention claimed is:

1. A method for fabricating a semiconductor device, the method comprising the steps of:
providing a substrate;
forming a TFT on the substrate, the TFT including a gate electrode, a semiconductor layer which is arranged to face the gate electrode with a gate insulating film interposed between them, and source and drain electrodes which are electrically connected to the semiconductor layer;
forming an insulating layer which contacts at least partially with the upper surface of the source and drain electrodes; and
conducting a heat treatment after performing the step of forming an insulating layer, wherein
the step of forming an insulating layer includes forming the insulating an $SiO_2$ layer using a first gas including silicon and hydrogen and a second gas including oxygen as reactive gases, and
in the step of forming the $SiO_2$ layer, a flow rate ratio of the first gas with respect to the second gas is initially set to a first value and then changed to a second value lower than the first value so that the content of hydrogen becomes higher in a region which is in contact with the source and drain electrodes than in a region which is out of contact with the source and drain electrodes.

2. The method of claim 1, wherein the semiconductor layer is an oxide semiconductor layer.

3. The method of claim 2, wherein the oxide semiconductor layer is an In—Ga—Zn—O based semiconductor layer.

4. The method of claim 1, wherein the heat treatment is carried out at a temperature of 200° C. to 400° C.

5. The method of claim 1, wherein the step of forming the insulating layer includes forming an $SiO_2$ layer by CVD process, and
in the step of forming the $SiO_2$ layer, an output RF voltage of the CVD process is changed.

6. The method of claim 1, wherein the step of forming the insulating layer includes forming an $SiO_2$ layer by CVD process, and
in the step of forming the $SiO_2$ layer, a film deposition pressure of the CVD process is changed.

7. The method of claim 1, wherein the step of forming the insulating layer includes forming a lower insulating layer by CVD process and forming an upper insulating layer on the lower insulating layer by sputtering process,
wherein the lower and upper insulating layers are formed so that the content of hydrogen becomes higher in the lower insulating layer than in the upper insulating layer.

8. The method of claim 1, wherein the step of forming the $SiO_2$ layer includes the steps of:
depositing a lower layer including hydrogen at a first content with the flow rate ratio being set to the first value, and
depositing, on the lower layer, an upper layer including hydrogen at a second content lower than the first content with the flow rate ratio being set to the second value.

9. The method of claim 8, wherein the reactive gases used in the step of depositing the lower layer and the reactive gases used in the step of depositing the upper layer are same.

10. The method of claim 1, wherein the reactive gases used in the step of forming the $SiO_2$ layer do not include fluorine.

11. The method of claim 1, the first gas is $SiH_4$ gas.

12. The method of claim 1, the second gas is $N_2O$ gas.

13. The method of claim 1, wherein the step of forming the TFT further includes a step of forming a channel protective layer which is interposed between the semiconductor layer and the source and drain electrodes and contacts with the semiconductor layer, the channel protective layer including $SiO_2$.

14. A method for fabricating a semiconductor device, the method comprising the steps of:
providing a substrate;
forming a TFT on the substrate, the TFT including a gate electrode, a semiconductor layer which is arranged to face the gate electrode with a gate insulating film interposed between them, source and drain electrodes which are electrically connected to the semiconductor layer, and a channel protective layer which is interposed between the semiconductor layer and the source and drain electrodes and contacts with the semiconductor layer, the channel protective layer including $SiO_2$;
forming an insulating layer which contacts at least partially with the upper surface of the source and drain electrodes; and conducting a heat treatment after performing the step of forming an insulating layer, wherein the step of forming an insulating layer includes forming the insulating layer so that the content of hydrogen becomes higher in a region which is in contact with the source and drain electrodes than in a region which is out of contact with the source and drain electrodes.

* * * * *